United States Patent [19]
Yang et al.

[11] Patent Number: 5,894,438
[45] Date of Patent: Apr. 13, 1999

[54] METHOD FOR PROGRAMMING AND ERASING A MEMORY CELL OF A FLASH MEMORY DEVICE

[75] Inventors: Tae Hum Yang; Young Dong Joo; Joo Young Kim; Jong Bae Jeong; Jong Seuk Lee, all of Kyoungki-do, Rep. of Korea

[73] Assignee: Hyundai Electronics Industries Co., Ltd., Rep. of Korea

[21] Appl. No.: 09/105,589

[22] Filed: Jun. 26, 1998

[30] Foreign Application Priority Data

Jun. 26, 1997 [KR] Rep. of Korea ............. 97-27850

[51] Int. Cl.$^6$ ........................................ G11C 16/04
[52] U.S. Cl. ..................... 365/185.18; 365/185.28; 365/185.29
[58] Field of Search ............... 365/185.18, 185.26, 365/185.27, 185.28, 185.29, 185.14, 185.33

[56] References Cited

U.S. PATENT DOCUMENTS 5,293,212  3/1994  Yamamoto et al. ............. 365/218
5,742,541  4/1998  Tanigami et al. ............. 365/185.3

*Primary Examiner*—David Nelms
*Assistant Examiner*—David Lam
*Attorney, Agent, or Firm*—Blakely Sokoloff Talyor & Zafman

[57] ABSTRACT

The present invention provides a method for programming and erasing a plurality of flash memory cells simultaneously while the power consumptions for those operations are significantly reduced, and the method for programming a memory cell of a flash memory device, wherein the memory cell is formed on a P-well surrounded by an N-well of a semiconductor substrate, including the steps of: applying a negative voltage to a control gate of the memory cell; applying a positive voltage to a drain of the memory cell; applying a positive voltage to the P-well, wherein the voltage is the same as or lower than the voltage applied to the drain; applying a power supply voltage to the N-well; and leaving a source of the memory cell uncoupled, wherein the steps are performed either in sequence or at random.

10 Claims, 3 Drawing Sheets

|  | WordLine(GATE) | | BitLine(DRAIN) | | SOURCE | P-well |
|---|---|---|---|---|---|---|
|  | SELECTED CELL | UNSELECTED CELL | SELECTED CELL | UNSELECTED CELL | | |
| ERASE | 10V | 0V | FLOATING | | −4V or FLOATING | −4V |
| PROGRAM | −11V | 0V | 5V | 0V | FLOATING | 1V~3V |
| READ | 5V | 0V | 1V | 0V | 0V | 0V |

FIG. 2

| | WordLine(GATE) | | BitLine(DRAIN) | | SOURCE | P-well |
|---|---|---|---|---|---|---|
| | SELECTED CELL | UNSELECTED CELL | SELECTED CELL | UNSELECTED CELL | | |
| ERASE | 10V | 0V | FLOATING | FLOATING | −4V or FLOATING | −4V |
| PROGRAM | −11V | 0V | 5V | 0V | FLOATING | 1V~3V |
| READ | 5V | 0V | 1V | 0V | 0V | 0V |

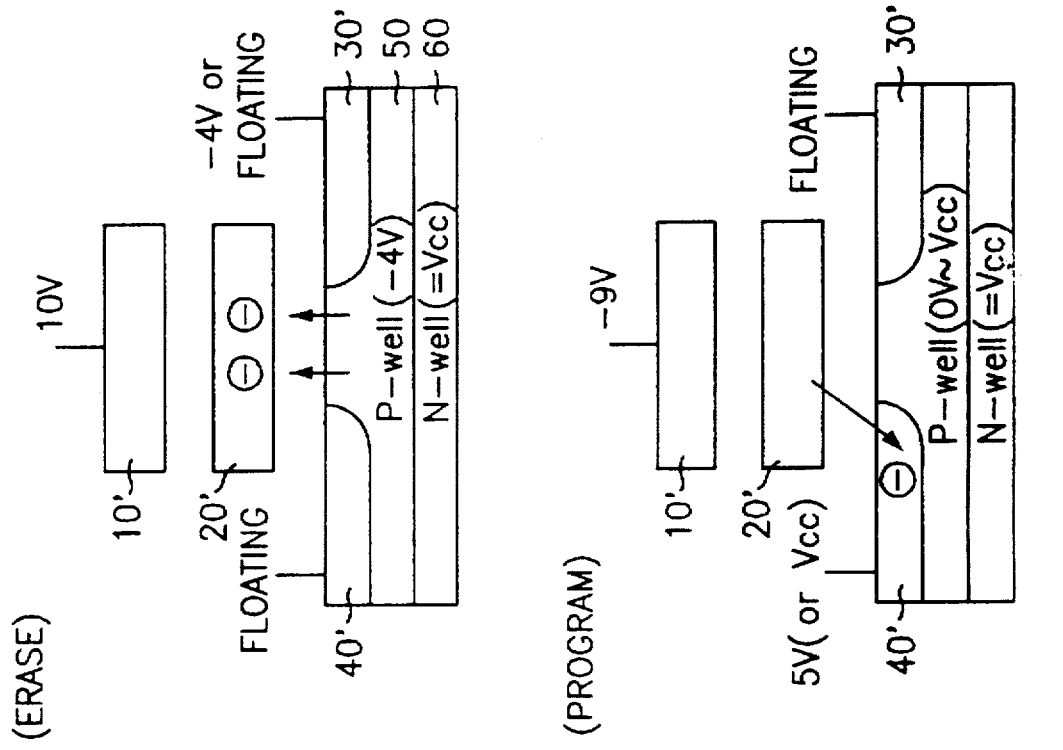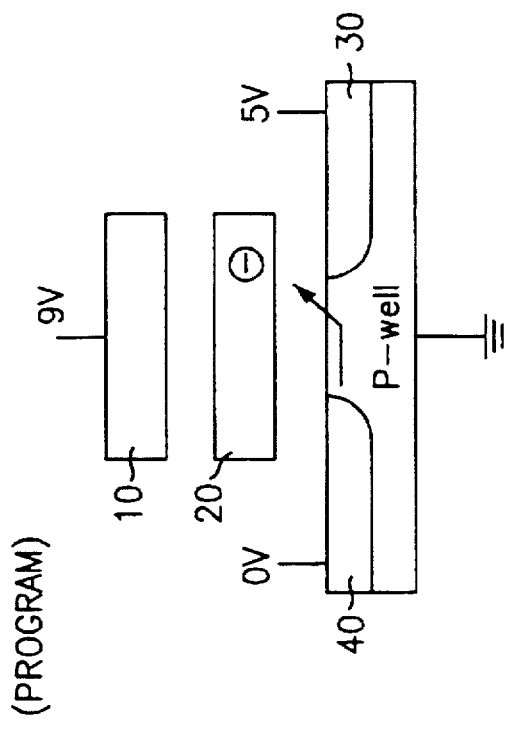

METHOD FOR PROGRAMMING AND ERASING A MEMORY CELL OF A FLASH MEMORY DEVICE

FIELD OF THE INVENTION

The present invention relates to a flash memory device, and more particularly to a method for programming and erasing a memory cell of a flash memory device("flash memory cell").

BACKGROUND OF THE INVENTION

With reference to FIGS. 1 and 3A, a conventional method for programming and erasing a conventional flash memory cell is described.

FIG. 1 is a schematic circuit diagram of a NOR type flash memory cell array and a table of conventional bias voltage conditions for some modes of operations, and FIG. 3A is a schematic cross-sectional diagram which shows the conventional mechanisms of programming and erasing.

In order to program a flash memory cell, a voltage of about 9V is applied to a control gate 10 of the selected memory cell, a power supply voltage Vcc of, e.g., 5V is applied to a bit line(drain) 40 of the selected memory cell and a ground voltage of, e.g., 0V is applied to other bit lines(not shown) of unselected memory cells(not shown). Under this bias condition, hot electrons are generated in the channel(not shown) in the vicinity of the drain of the selected memory cell and injected into a floating gate 20 of the memory cell.

While the above described programming process, a large amount of current of 300 µA to 500 µA is dissipated per each memory cell. Therefore, under the above described bias condition, only one word or byte of memory cells can be programmed at the same time. This becomes especially serious problem for portable apparatus which uses battery as power supply.

Further, in order to erase the flash memory cell, a voltage of about −9V is applied to the control gate 10 of the selected memory cell, the power supply voltage Vcc of 5V is applied to the source 30 of the selected memory cell. While erasing the flash memory cell, the drain 40 is left floated, which means the drain is not coupled to anything. Then, a strong electric field is established between the floating gate 20 and the source 30, so that the electrons stored in the floating gate 20 are ejected to the source 30 by Fowler-Nordheim tunneling("F-N tunneling"). Due to these ejected electrons, a leakage current is generated in the vicinity of the source 30.

One of the solutions to reduce this leakage current is to form a double diffused junction as the source junction. However, the double diffused source junction results in a lateral diffusion, so that the size of the memory cell is increased.

SUMMARY OF THE INVENTION

Therefore, the present invention has been made in view of the above mentioned problem, and the present invention provides a method for programming and erasing a plurality of flash memory cells at the same time with low power consumption.

In accordance with the present invention, there is disclosed a method for programming a memory cell of a flash memory device, wherein the memory cell is formed on a P-well surrounded by an N-well of a semiconductor substrate, including the steps of: applying a negative voltage to a control gate of the memory cell; applying a positive voltage to a drain of the memory cell; applying a positive voltage to the P-well, wherein the voltage is the same as or lower than the voltage applied to the drain; applying a power supply voltage to the N-well; and leaving a source of the memory cell floated, wherein the steps are performed either in sequence or at random.

In accordance with the present invention, there is also disclosed a method for erasing a memory cell of a flash memory device, wherein the memory cell is formed on a P-well surrounded by an N-well of a semiconductor substrate, including the steps of: applying a positive voltage to a control gate of the memory cell; applying a negative voltage to the P-well; applying a power supply voltage to the N-well; and applying a negative voltage to a source of the memory cell; wherein the steps are performed either in sequence or at random.

BRIEF DESCRIPTION OF THE DRAWINGS

A further understanding of the nature and advantage of the present invention will become apparent by reference to the remaining portions of the specification and drawings, in which;

FIG. 2 is a table of bias voltage conditions for three modes of operations according to the present invention;

FIG. 3A is a schematic cross-sectional diagram which shows the conventional mechanisms of programming and erasing;

FIG. 3B is a schematic cross-sectional diagram which shows the mechanisms of programming and erasing according to the present invention.

DETAILED DESCRIPTION OF THE PREFERRED EMBODIMENT

Figure 1:
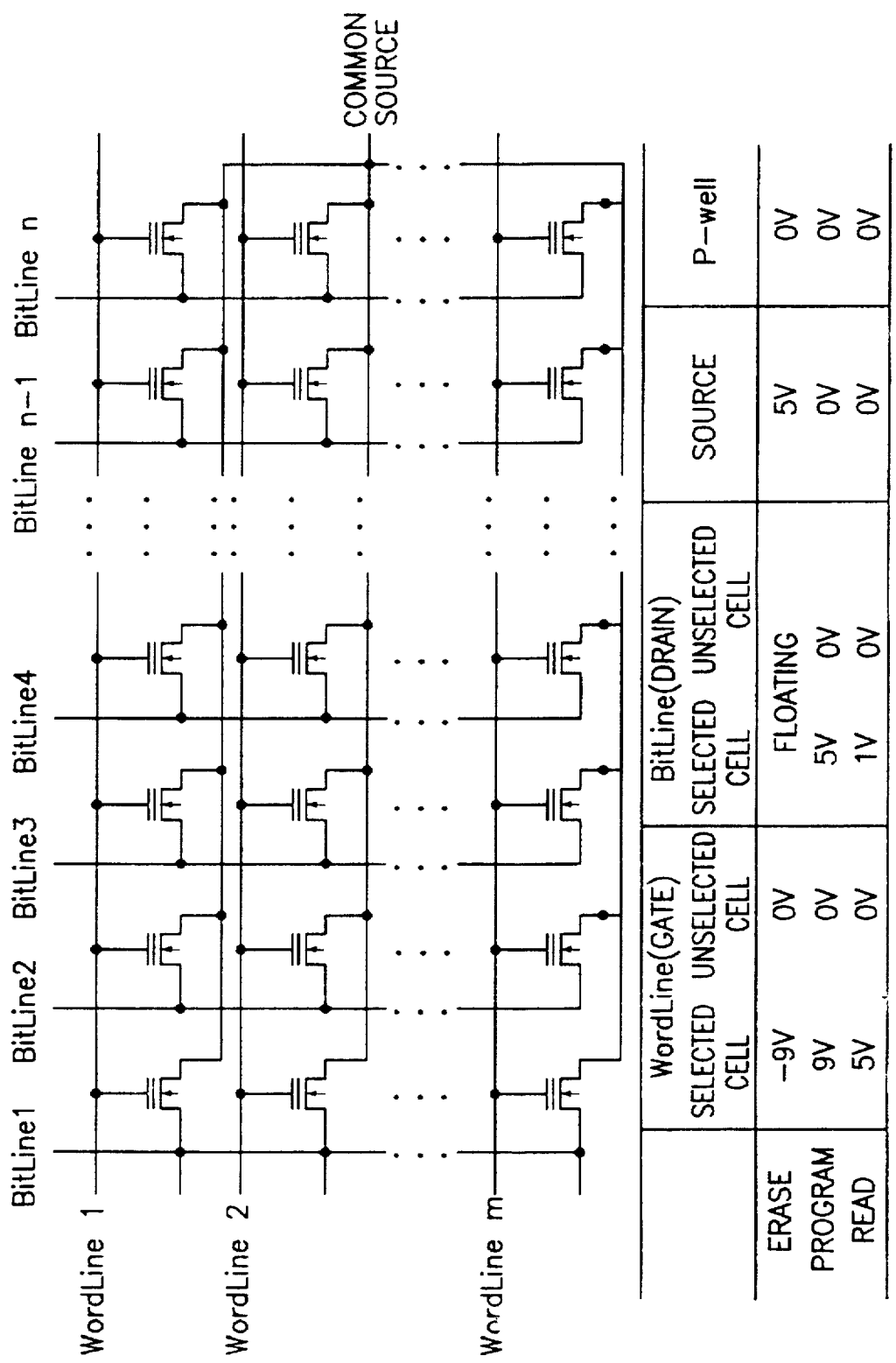
FIG. 1 is a schematic circuit diagram of a NOR type flash memory cell array and a table of conventional bias voltage conditions for three modes of operations.

A detailed description of an embodiment according to the present invention will be given below with reference to the attached drawings.

One of the most outstanding features of the present invention is the use of triple well structure flash memory cell having triple P-well. The other one is that the charged state of the floating gate is switched from the conventional one. In other words, according to the present invention, the floating gate is charged by electrons when the flash memory cell is erased, and the charged electrons are ejected from the floating gate when it is programmed. Further, according to the present invention, the F-N tunneling is used for both programming and erasing.

Now, referring to FIGS. 2 and 3B, FIG. 2 is a table of bias voltage conditions for three modes of operations according to the present invention, FIG. 3B is a schematic cross-sectional diagram which shows the mechanisms of programming and erasing according to the present invention. The bias voltages described in FIGS. 2 and 3B represent the preferred values of an embodiment of the present invention, and when this invention is put into practice, the real values of the bias voltages are adjusted to proper values within ranges which will be described in detail hereinafter.

In order to program a flash memory cell according to an embodiment of the present invention, the gate 10' of the flash memory cell is biased by a negative voltage in the range of about −8V to about −11V and the drain 40' is biased by a positive voltage in the range of about 3V to about 5V. A P-well 50, which is surrounded by an N-well 60 of a semiconductor substrate, is biased by a positive voltage in the range of about 0V to the power supply voltage Vcc, wherein the voltage applied to the P-well 50 is the same as or lower than the voltage applied to the drain 40'. The N-well 60 is biased by a voltage which is the same as or higher than the voltage applied to the P-well 50. Finally, the source 30' is left floated.

Under this bias condition, the electrons stored in the floating gate 20' are ejected to the drain 40' by F-N tunneling. The ground voltage is applied to the drains(not shown) of the unselected memory cells(not shown) so that no tunneling can occur between the floating gates and the drains of the unselected memory cells.

In order to erase the flash memory cell according to an embodiment of the present invention, the gate 10' is biased by a positive voltage in the range of about 8V to about 12V. The P-well 50 is biased by a negative voltage, e.g. −4V. The source 30' is biased by a negative voltage in the range of the ground voltage to the voltage applied to the P-well 50, so that an inverted layer(not shown) is formed beneath the channel(not shown). Finally, the drain 40' is left floated. Under this bias condition, the electrons are injected into the floating gate 20' from the channel by F-N tunneling.

According to another embodiment of the present invention, in order to erase the flash memory cell, instead of applying a negative voltage to the source 30', the source 30' is left floated, the P-well 50 is biased by a negative voltage, e.g. −4V, and the control gate 10' is biased by a positive voltage, e.g. 10V.

The above described bias conditions can be applied to all types of flash memory cells and especially useful to a flash memory device of high data transfer rate because a multi-bit programming is possible.

As described above, the present invention uses F-N tunneling for programming, only the current of about 10 nA is consumed for one memory cell so that many memory cells can be programmed at the same time and the power consumption is decreased. Further, since the drain voltage is substantially decreased due to the bias voltage applied to the P-well, the leakage current is decreased and the device reliability is increased by substantially removing the disturbance effect.

Still further, when the memory cell is erased, an inverted layer is formed under the channel, so that the leakage current is reduced and the normal junction structure can be used instead of the conventional double diffused junction structure. Therefore, the size of the memory cell can be reduced.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for programming a memory cell of a flash memory device, wherein said memory cell is formed on a P-well surrounded by an N-well of a semiconductor substrate, comprising the steps of:

applying a negative voltage to a control gate of said memory cell;

applying a positive voltage to a drain of said memory cell;

applying a positive voltage to said P-well, wherein said voltage is the same as or lower than said voltage applied to said drain;

applying a power supply voltage to said N-well; and leaving a source of said memory cell floated, wherein said steps are performed either in sequence or at random.

2. A method as claimed in claim 1, wherein said voltage applied to said control gate is in the range of about −8V to about −11V.

3. A method as claimed in claim 1, wherein said voltage applied to said drain is in the range of about 3V to about 5V.

4. A method for erasing a memory cell of a flash memory device, wherein said memory cell is formed on a P-well surrounded by an N-well of a semiconductor substrate, comprising the steps of:

applying a positive voltage to a control gate of said memory cell;

applying a negative voltage to said P-well;

applying a power supply voltage to said N-well; and applying a negative voltage to a source of said memory cell;

wherein said steps are performed either in sequence or at random.

5. A method as claimed in claim 4, wherein said voltage applied to said control gate is in the range of about 8V to about 12V.

6. A method as claimed in claim 4, wherein said voltage applied to said P-well is about −4V.

7. A method as claimed in claim 6, wherein said voltage applied to said source is in the range of the voltage applied to said P-well to about 0V.

8. A method as claimed in claim 4, wherein said voltage applied to said source is in the range of the voltage applied to said P-well to about 0V.

9. A method as claimed in claim 4, wherein said source is left floated instead of being applied by said voltage.

10. A method as claimed in claim 4 further comprising the step of leaving a drain of said memory cell floated.

* * * * *

UNITED STATES PATENT AND TRADEMARK OFFICE
CERTIFICATE OF CORRECTION

PATENT NO. : 5,894,438
DATED : April 13, 1999    PAGE 1 OF 2
INVENTOR(S) : Yang et al.

It is certified that errors appear in the above-identified patent and that said Letters Patent is hereby corrected as shown below:   On the title page:

In [56], delete "Blakely Sokoloff Talyor & Zafman" and insert -- Blakely Sokoloff Taylor & Zafman -- .

In column 1, line 7, delete "device("flash memory cell")." and insert -- device ("flash memory cell"). -- .

In column 1, line 26 delete "lines(not shown) of unselected memory cells(not shown)" and insert -- lines (not shown) of unselected memory cells (not shown) -- .

In column 1, line 28, delete "channel(not shown)" and insert -- channel (not shown) -- .

In column 1, line 49 delete "tunneling("F-N tunneling")." and insert -- tunneling ("F-N tunneling"). -- .

In column 3, line 11, delete "drains(not shown)" and insert -- drains (not shown) -- .

In column 3, line 12, delete "cells(not shown)" and insert -- cells (not shown) -- .

UNITED STATES PATENT AND TRADEMARK OFFICE
CERTIFICATE OF CORRECTION

PATENT NO. : 5,894,438
DATED : April 13, 1999
INVENTOR(S) : Yang et al.

It is certified that errors appear in the above-identified patent and that said Letters Patent is hereby corrected as shown below:

In column 3, line 21, delete "layer(not shown)" and insert -- layer (not shown) -- .

In column 3, line 22, delete "channel(not shown)" and insert -- channel (not shown) -- .

Signed and Sealed this

Twenty-eighth Day of November, 2000

Attest:

Q. TODD DICKINSON

*Attesting Officer*     *Director of Patents and Trademarks*